(12) United States Patent
Tanaka

(10) Patent No.: US 11,304,350 B2
(45) Date of Patent: Apr. 12, 2022

(54) BOARD WORK MACHINE AND INSERTION METHOD

(71) Applicant: FUJI CORPORATION, Chiryu (JP)

(72) Inventor: Katsunori Tanaka, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 231 days.

(21) Appl. No.: 15/776,259

(22) PCT Filed: Nov. 20, 2015

(86) PCT No.: PCT/JP2015/082696
§ 371 (c)(1),
(2) Date: May 15, 2018

(87) PCT Pub. No.: WO2017/085864
PCT Pub. Date: May 26, 2017

(65) Prior Publication Data
US 2019/0269051 A1    Aug. 29, 2019

(51) Int. Cl.
*H05K 3/30* (2006.01)
*H05K 13/08* (2006.01)
*H05K 13/04* (2006.01)

(52) U.S. Cl.
CPC ..... *H05K 13/0812* (2018.08); *H05K 13/0408* (2013.01); *H05K 13/0413* (2013.01); *H05K 13/0421* (2013.01); *H05K 13/0813* (2018.08)

(58) Field of Classification Search
CPC ............... H05K 13/04; H05K 13/0404; H05K 13/0406; H05K 13/046
See application file for complete search history.

(56) References Cited

U.S. PATENT DOCUMENTS

| 6,769,172 B2* | 8/2004 | Suhara | H05K 13/0409 |
| | | | 29/740 |
| 8,778,705 B2* | 7/2014 | Chew | B29C 33/0016 |
| | | | 257/E31.117 |
| 9,992,918 B2* | 6/2018 | Watanabe | H05K 13/0408 |

FOREIGN PATENT DOCUMENTS

| JP | 57-84129 A | 5/1982 |
| JP | 6-244595 A | 9/1994 |

(Continued)

OTHER PUBLICATIONS

International Search Report dated Feb. 23, 2016, in PCT/JP2015/082696 filed Nov. 20, 2015.

*Primary Examiner* — Paul D Kim
(74) *Attorney, Agent, or Firm* — Oblon, McClelland, Maier & Neustadt, L.L.P.

(57) ABSTRACT

In a component mounter provided with a holding tool configured to hold leaded component, a moving device configured to move the holding tool, and an imaging device configured to image a leaded component held by the holding tool, the lengths of the pair of leads of leaded component are different. With respect to this, operation of the moving devices is controlled based on imaging data of the leaded component captured by the imaging device, and the tip section of long lead of the pair of leads of the leaded component held by the holding tool is inserted in a through-hole. Next, leaded component is moved such that short lead is positioned above a through-hole, and the short lead is inserted into the through-hole. That is, the pair of leads are inserted into the through-holes in order of proximity of the tips to circuit board, closer leads being inserted earlier.

5 Claims, 17 Drawing Sheets

(56) References Cited

FOREIGN PATENT DOCUMENTS

JP 2015-95574 A 5/2015
WO WO 2015/029209 A1 3/2015

* cited by examiner

BOARD WORK MACHINE AND INSERTION METHOD

TECHNICAL FIELD

The present application relates to a board work machine that mounts leaded components on a board, and to an insertion method for inserting a lead of a leaded component into a through-hole of a board.

BACKGROUND ART

Leaded components usually have multiple leads, and each lead is inserted into a through-hole formed in the board. Therefore, it is desirable to appropriately insert the multiple leads into the through-holes, and technology for inserting multiple leads into through-holes is disclosed in the patent literature below.

Patent literature 1: JP-A-2015-95574

BRIEF SUMMARY

Technical Problem

According to technology disclosed in the above patent literature, it is possible to a certain extent to insert multiple leads into through-holes. However, in the above patent literature, although it is disclosed to use an imaging means and imaging data from the imaging means when inserting a lead into a through-hole, details regarding the reliability of the means are not disclosed, and it is desirable to more appropriately insert leads into through-holes. The present disclosure takes account of such circumstances, and an object thereof is to appropriately insert multiple leads into through-holes.

Solution to Problem

To solve the above problem, a board work machine of the present disclosure includes: a holding tool configured to hold a leaded component having multiple leads; a moving device configured to move the holding tool; an imaging device configured to image the leaded component held by the holding tool; and a control device configured to control operation of the moving device based on image data of the leaded component from the imaging device such that the multiple leads of the leaded component held by the holding tool are inserted into through-holes formed in the board in order based on proximity to the board of a tip of the leads, leads with the tip closer to the board being inserted earlier.

Also, to solve the above problem, an insertion method of the present disclosure is for a board work machine provided with a holding tool configured to hold a leaded component with multiple leads and a moving device configured to move the holding tool, the insertion method including: inserting the leads of the leaded component being held by the holding tool into through-holes of a board, wherein the multiple leads of the leaded component held by the holding tool are inserted into the through-holes formed in the board in order based on proximity to the board of a tip of the leads, leads with the tip closer to the board being inserted earlier.

Advantageous Effects

With a board work machine and an insertion method of the present disclosure, multiple leads are inserted into through-holes in order based on proximity to the board of a tip of the leads, leads with the tip closer to the board being inserted earlier. Thus, even if leads are bent or the like, multiple leads can be appropriately inserted in order into the through-holes.

DESCRIPTION OF PREFERRED EMBODIMENTS

The following describes in detail referring to the figures an example embodiment of the present disclosure.

Configuration of Component Mounter

Figure 1:
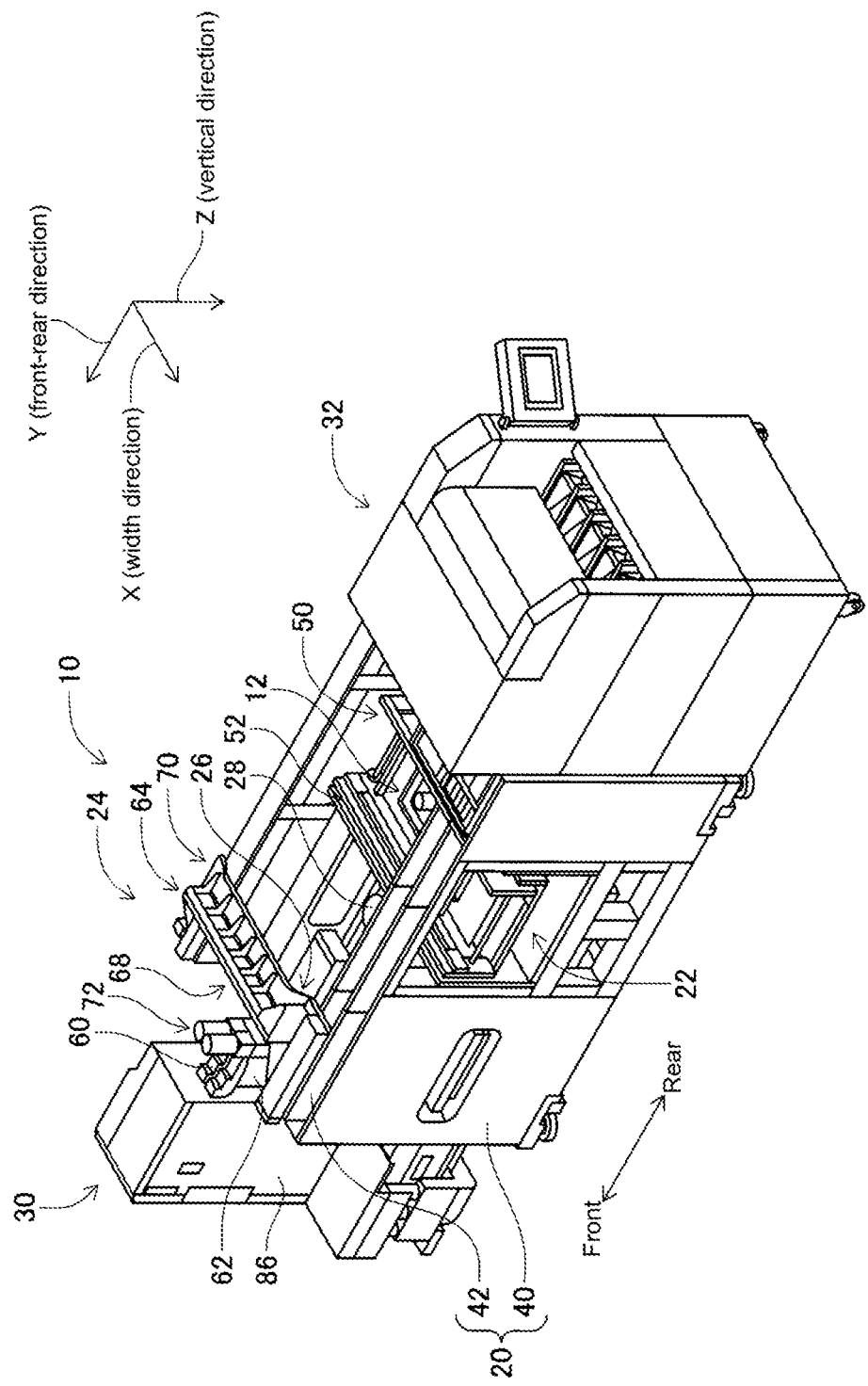
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 7) 34, and control device (refer to FIG. 11) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Component mounting device 24 is provided on beam section 42, and includes work heads 60 and 62 and work head moving device 64. Work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Figure 2:
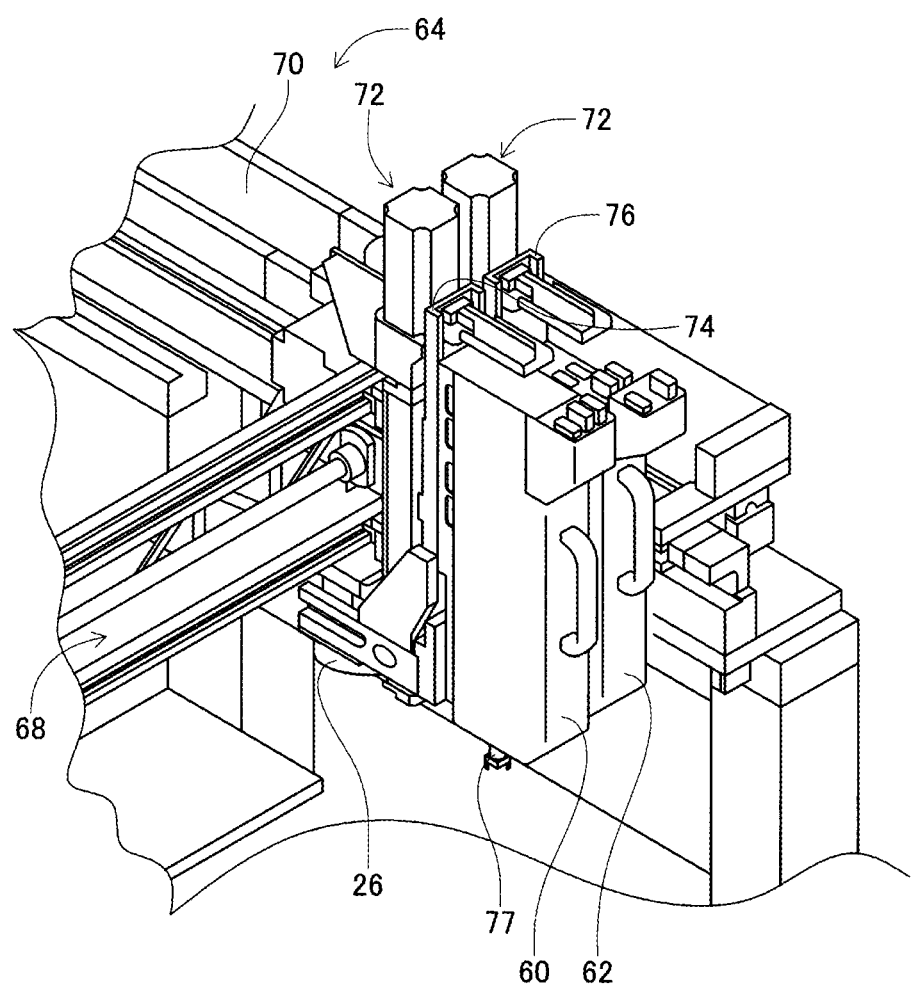
FIG. 2 is a perspective view of a component mounting device.
Figure 3:
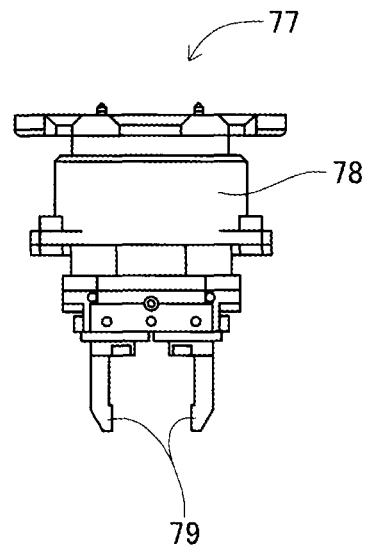
FIG. 3 shows a component holding tool.

Also, as shown in FIG. 2, component holding tool 77 is attached to the bottom surface of each work head 60 and 62. Component holding tool 77 is a chuck, and as shown in FIG. 3, includes main body section 78 and pair of claw sections 79. The pair of claw sections 79 are provided extending down from the bottom surface of main body section 78, and are able to slide towards and away from each other. Thus, component holding tool 77 sandwiches a component between the pair of claw sections 79 by the pair of claw sections 79 being moved towards each other, and releases the component from the pair of claw sections 79 by the pair of claw sections 79 being moved away from each other.

As shown in FIG. 2, mark camera 26 is attached to slide 74 in a state facing downwards, and is moved in the X direction, Y direction, and Z direction together with work head 60. Thus, mark camera 26 images any position on frame section 40.

Figure 4:
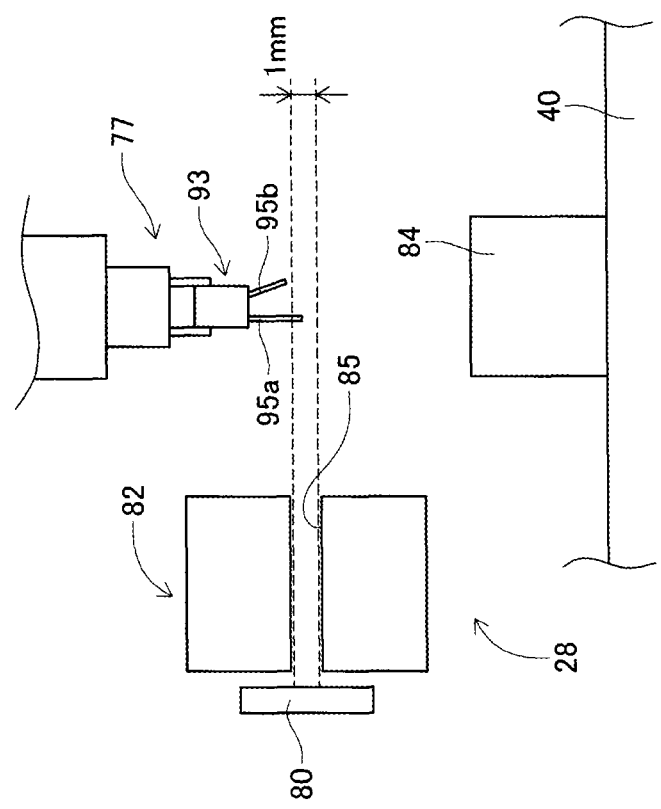
FIG. 4 is a schematic view of a component camera.

As shown in FIG. 1, component camera 28 is provided on frame section 40 between board conveying and holding device 22 and component supply device 30. As shown in FIG. 4, component camera 28 is provided with side lighting device 80, shading block 82, and camera 84. Side lighting device 80 is for shining light on a component held by component holding tool 77 from the side. Note that, as described in detail later, because component camera 28 is used when calculating level distances in the Z direction of the tip of the leads of the leaded component, side lighting device 80 shines light horizontally such that the level distance can be recognized. Also, shading block 82 is provided between side lighting device 80 and component holding tool 77. Slit 85 is formed in shading block 82 so as to extend in a substantially horizontal direction. Light shines onto a component held by component holding tool 77 from slit 85. The width of slit 85 is approximately 1 mm. That is, horizontal light with a width in the vertical direction of approximately 1 mm is shone towards a component held by component holding tool 77. Also, camera 84 is provided on frame section 40 in a state facing up. According to such a configuration, light shone from side lighting device 80 is reflected by the component held by component holding tool 77, and the reflected light enters camera 84. By this, the component held by component holding tool 77 is imaged.

Figure 5:
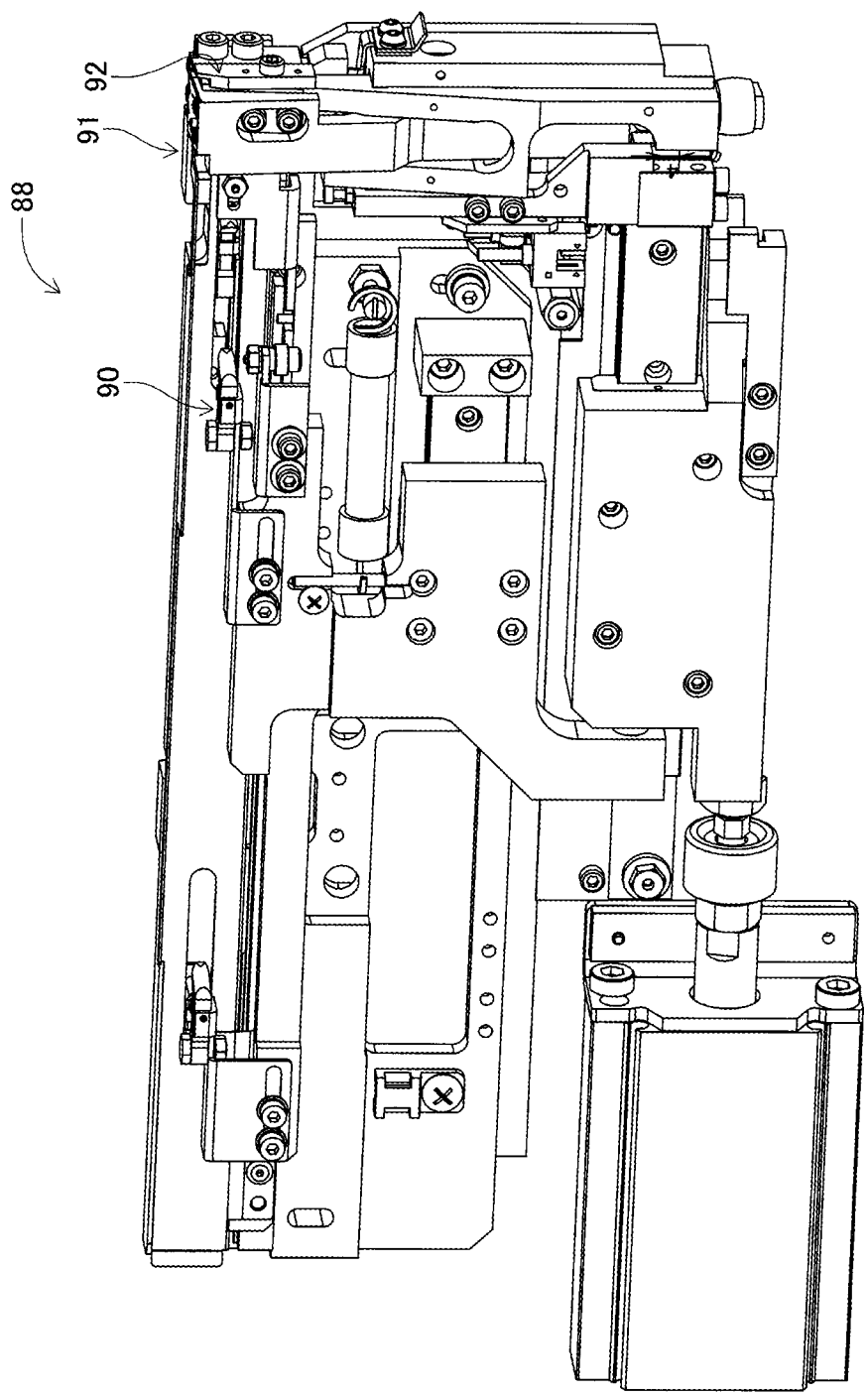
FIG. 5 is a perspective view of a tape feeder.

As shown in FIG. 1, component supply device 30 is provided at an end of frame section 40 in the front-rear direction. Component supply device 30 includes tray-type component supply device 86 and feeder-type component supply device (refer to FIG. 11) 87. Tray-type component supply device 86 supplies components in a state arranged in a tray. Also, tape feeder 88 shown in FIG. 5 is loaded on feeder-type component supply device 87. Tape feeder 88 is provided with tape feeding mechanism 90, lead holding mechanism 91, and lead cutting mechanism 92.

Tape feeding mechanism 90 feeds taped components (not shown) to a leading end of tape feeder 88. Taped components are configured from multiple leaded components 93 (refer to FIG. 13) and carrier tape (not shown). Leaded components 93 include component main body section (refer to FIG. 13) 94, and two leads (refer to FIG. 13) 95 that extend from the bottom surface of component main body section 94. Also, the two leads 95 of leaded component 93 are taped to the carrier tape at the lead tips. Further, lead holding mechanism 91 is provided at the leading end of tape feeder 88, and leaded components 93 of taped components fed by tape feeding mechanism 90 are held by the two leads 95.

Figure 6:
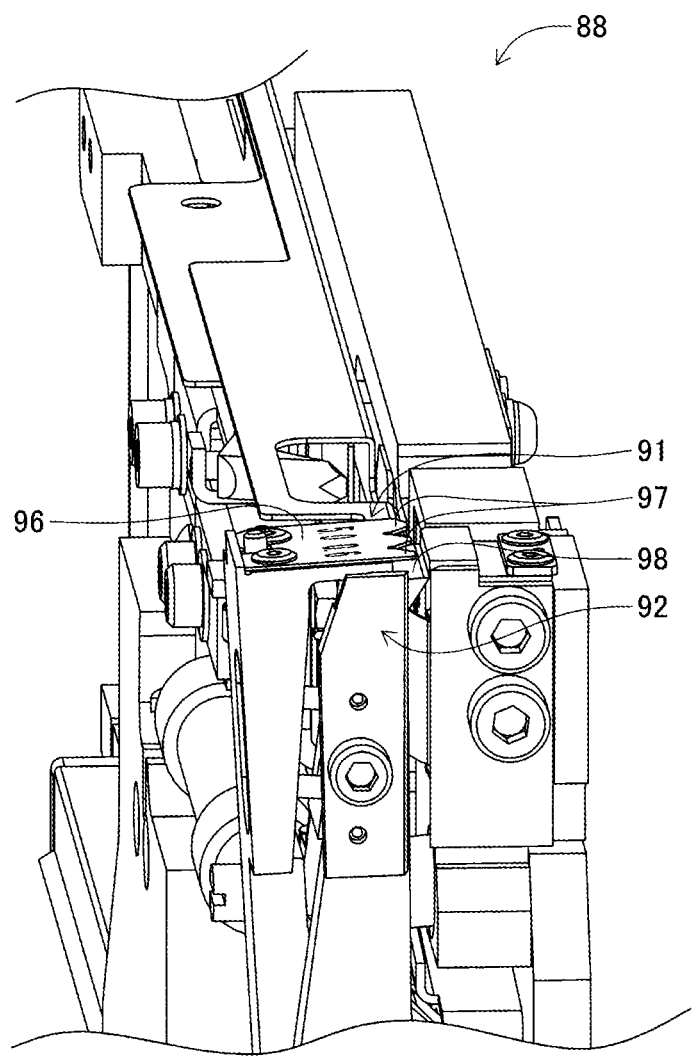
FIG. 6 shows an enlarged view of the tape feeder.

In detail, as shown in FIG. 6, lead holding mechanism 91 includes lead holding plate 91. A pair of V-shaped cutout sections 97 are formed on one side of lead holding plate 96. The pair of leads 95 of leaded component 93 are held by those pair of cutouts 97. Also, lead cutting mechanism 92 is provided below lead holding plate 96. Lead cutting mechanism 92 includes lead cutter 98 and lead cutter 98 is provided in a state parallel to lead holding plate 96. By operating lead cutter 98 via the driving of lead cutting mechanism 92, leads 95 held in the cutout sections 96 of lead holding plate 96 are cut by lead cutter 98. Thus, leaded component 93 is separated from the carrier tape and supplied in a state held by lead holding plate 96. That is, leaded component 93 is supplied at the position at which lead holding plate 96 is provided.

Note that, the upper surface of lead cutter 98 is a stepped surface, and the distance between the upper surface of lead cutter 98 and one of the pair of cutout sections 97 of lead holding plate 96 is different to the distance between the upper surface of lead cutter 98 and the other of the pair of cutout sections 97 of lead holding plate 96. Thus, the lengths of the leads 95 cut by lead cutter 98, that is, the length of the lead 95 held in one of the pair of cutout sections 97 of lead holding plate 96 and the length of the lead 95 held in the other of the pair of cutout sections 97 of lead holding plate 96, are different. That is, for a leaded component supplied by tape feeder 88, the lengths of the pair of leads 95 are different. Note that, the difference in the stepped surfaces of lead cutter 98 is approximately 1.5 mm. Therefore, for leaded components 93 supplied by tape feeder 88, the difference between the length of the longer of the pair of leads 95 and the shorter of the pair of leads 95 is approximately 1.5 mm.

Also, as shown in FIG. 1, loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Figure 7:
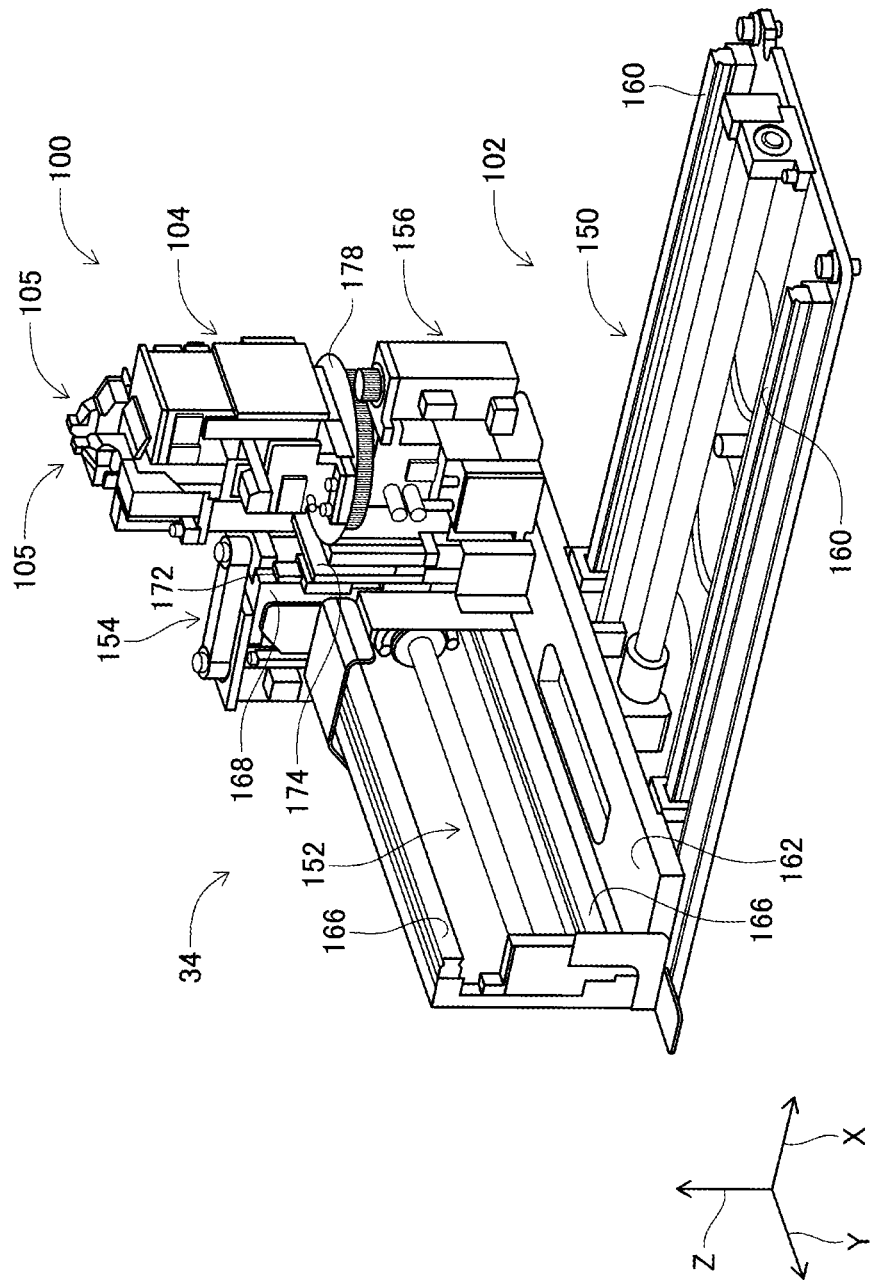
FIG. 7 is a perspective view of a cut and clinch device.
Figure 8:
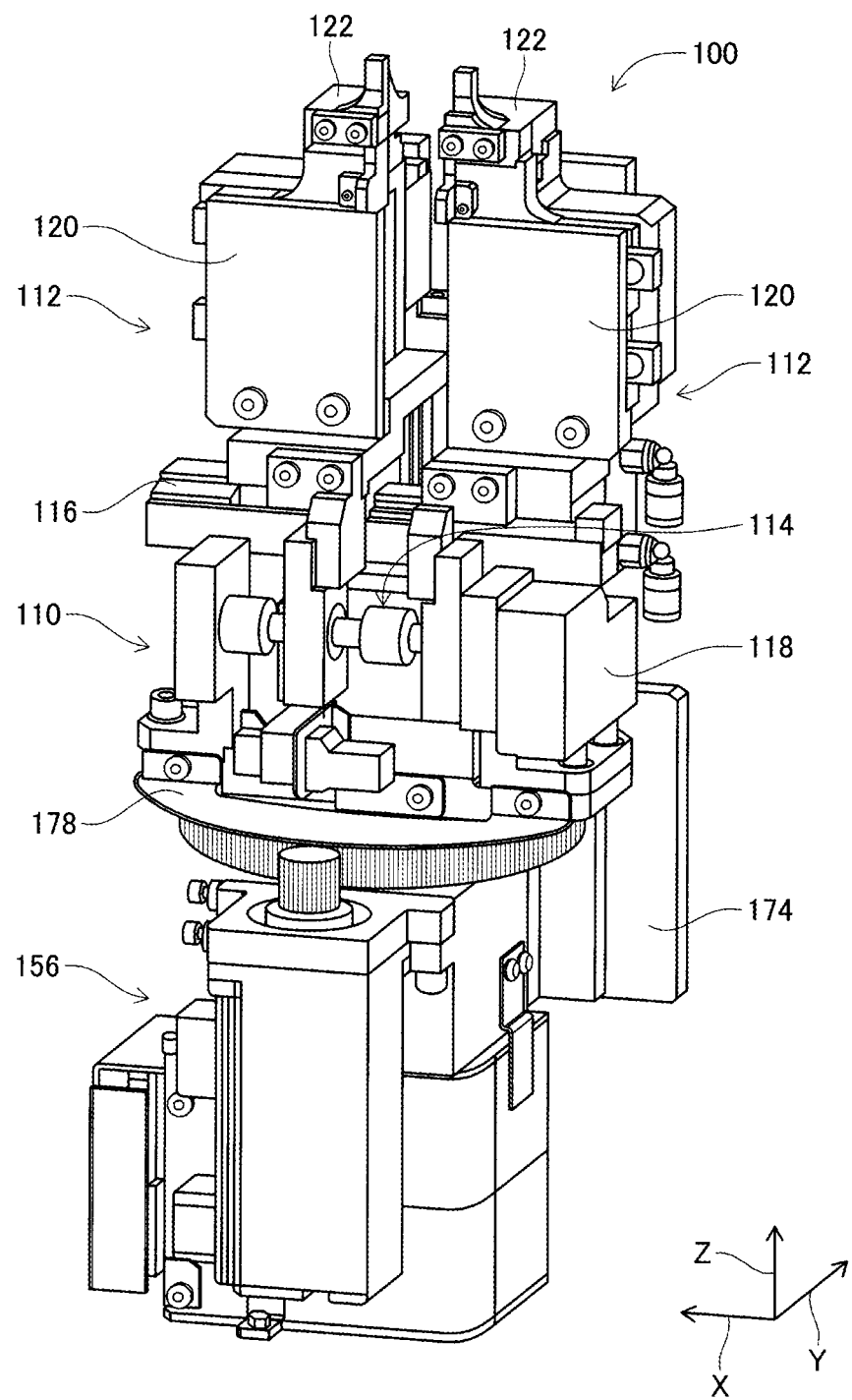
FIG. 8 is a perspective view of a cut and clinch unit.

Further, cut and clinch device 34 is arranged below conveyance device 50 and, as shown in FIG. 7, includes cut and clinch unit 100 and unit moving device 102. As shown in FIG. 8, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. By this, the pair of slide bodies 112 move towards and away from each other in the X direction. Also, pitch changing mechanism 114 includes electromagnetic motor 118, and the distance between the pair of slide bodies 112 can be controllably changed by operation of electromagnetic motor 118.

Figure 9:
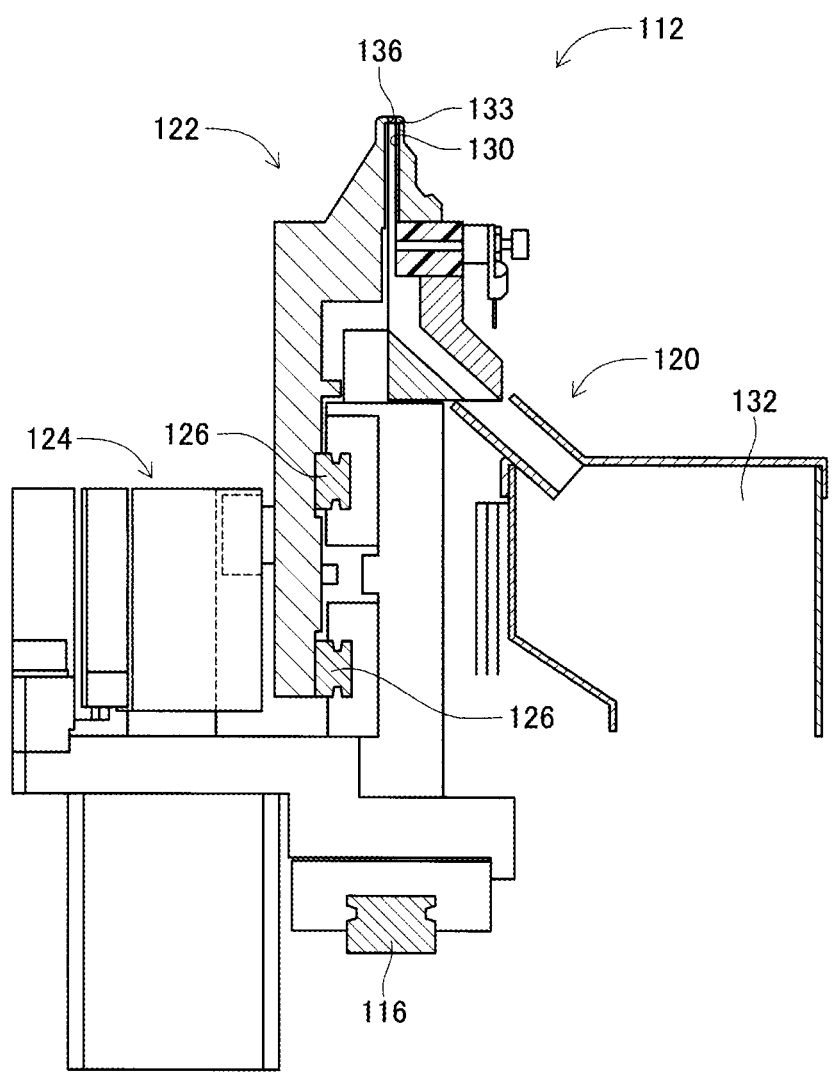
FIG. 9 is a cross section of a slide body.

Also, as shown in FIG. 9, each of the pair of slide bodies 112 includes fixed body section 120, movable section 122, and slide device 124, and is supported at fixed body section 120 so as to be slidable on slide rail 116. Two slide rails 126 are fixed to the rear side of fixed body section 120 extending in the X direction, and movable section 122 is slidably supported by those two slide rails 126. Thus, movable section 122 slides in the X direction with respect to fixed section 120. Also, slide device 124 includes electromagnetic motor (refer to FIG. 11) 128, and movable section 122 is controllably slid by operation of electromagnetic motor 128.

Also, the upper end section of fixed body section 120 is formed tapered towards the end, and first insertion hole 130 is formed so as to pierce the upper end section in a vertical direction. The upper end of first insertion hole 130 opens at the upper end surface of fixed section 120, and the edge that opens to the upper end surface is formed as fixed blade (refer to FIG. 17) 131. Also, the lower end of first insertion hole 130 opens to a side surface of fixed section 120, and discard box 132 is provided below the opening to the side surface.

Figure 10:
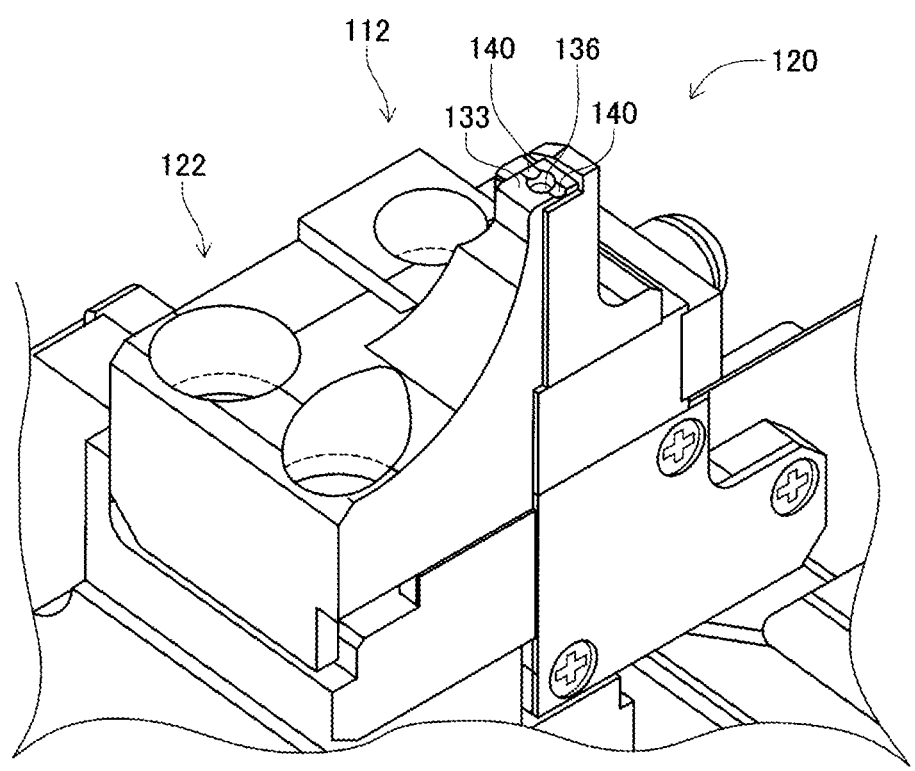
FIG. 10 is an enlarged view of the slide body.

Further, as shown in FIG. 10, an upper end section of movable section 122 is also formed tapered towards the end, and L-shaped curved section 133 is formed at the upper end section of movable section 122. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Note that, second insertion hole 136 pierces through curved section 133 in a vertical direction, and an internal surface of second insertion hole 136 is a tapered surface configured with a diameter that gets smaller going down. Further, the edge of second insertion hole 136 that opens to the lower end surface of curved section 133 is formed as movable blade 138 (refer to FIG. 17). Further, guide groove 140 is formed in the upper end surface of curved section 133 extending in the X-axis direction, that is, the sliding direction of movable section 122. Guide groove 140 is formed to straddle the opening of second insertion hole 136, and guide groove 140 and second insertion hole 136 are linked. Also, guide groove 140 is open at both side surfaces of curved section 133.

Also, as shown in FIG. 7, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. Also, X slider 162 moves in the X direction by the driving of electromagnetic motor (refer to FIG. 11) 164. Y-direction moving device 152 includes slide rail 166 and Y slider 168. Slide rail 166 is arranged on X slider 162 extending in the Y direction, and Y slider 168 is slidably supported on slide rail 166. Also, Y slider 168 moves in the Y direction by the driving of electromagnetic motor (refer to FIG. 11) 170. Z-direction moving device 154 includes slide rail 172 and Z slider 174. Slide rail 172 is arranged on Y slider 168 extending in the Z direction, and Z slider 174 is slidably supported on slide rail 172. Also, Z slider 174 moves in the Z direction by the driving of electromagnetic motor (refer to FIG. 11) 176.

Further, rotation device 156 includes rotating table 178 that is roughly disc-shaped. Rotating table 178 is supported by Z slider 174 so as to be rotatable around its own center, and is rotated by the driving of electromagnetic motor (refer to FIG. 11) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. Thus, cut and clinch unit 100 can be positioned at any position under circuit board 12 held by clamp device 52.

Figure 11:
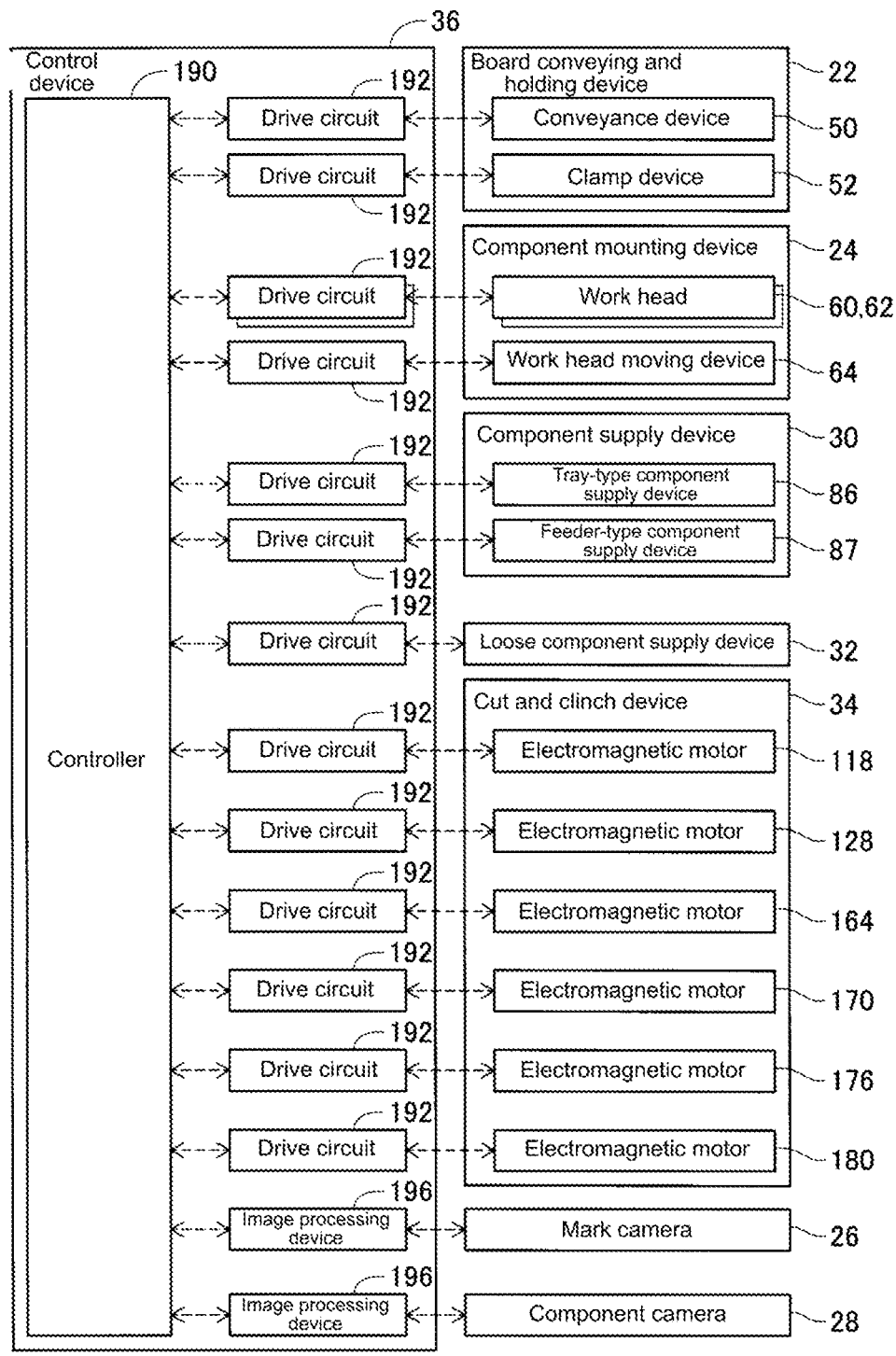
FIG. 11 is a block diagram showing a control device.

As shown in FIG. 11, control device 36 is provided with controller 190, multiple drive circuits 192, and image processing device 196. The multiple drive circuits 192 are connected to conveyance device 50, clamp device 52, work heads 60 and 62, work head moving device 64, tray type component supply device 86, feeder type component supply device 87, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which leaded components are mounted on circuit board 12.

Specifically, circuit board 12 is conveyed to a work position, and is fixedly held at that position by clamp device 52. Also, cut and clinch unit 100 moves below circuit board 12. Cut and clinch unit 100 is moved such that coordinates in the XY directions of second insertion hole 136 of movable section 122 and coordinates in the XY directions of through-holes (refer to FIG. 12) 200 of circuit board 12 match, the upper surface of movable section 122 and the lower surface of circuit board 12 do not contact each other, and the upper surface of movable section 122 is slightly below the lower surface of circuit board 12.

Specifically, with cut and clinch unit 100, the distance between the pair of slide bodies 112 is adjusted by pitch changing mechanism 114 such that the distance between the pair of second insertion holes 136 of movable section 122 of slide body 122 is the same as the distance between the two through-holes 200 formed in circuit board 12. And, by operation of unit moving device 102, cut and clinch unit 100 is moved in the XYZ directions and rotated. Thus, the coordinates in the XY directions of second insertion hole 136 of movable section 122 and coordinates in the XY directions of through-holes 200 of circuit board 12 match, the upper surface of movable section 122 and the lower surface of circuit board 12 do not contact each other, and the upper surface of movable section 122 is slightly below the lower surface of circuit board 12.

Also, when circuit board 12 is fixedly held by clamp device 52, mark camera 26 moves above circuit board 12 and images circuit board 12. And, controller 190 calculates information related to a holding position of a circuit board and the like based on the imaging data. Also, component supply device 30 or loose component supply device 32 supplies components at a specified supply position. Then, one of the work heads 60 or 62 moves above the component supply position and holds a leaded component using component holding tool 77.

Continuing, work head 60 or 62 holding the leaded component is moved above component camera 28, and imaging is performed by component camera 28. Here, the leaded component held by component holding tool 77 is imaged, and based on the imaging data, information related to the holding orientation of the leaded component by component holding tool 77 is calculated, and mounting work of mounting the leaded component on circuit board 12 is performed using the information related to the holding orientation. In detail, the positions of the tip of the leads of the leaded components are calculated based on the imaging data of the leaded component. Note that, "calculating" here refers to a concept including processing by a computer of controller 190 or the like, and is used to acquire a specific value by performing processing on various data. Next, operation of X-direction moving device 68 and Y-direction moving device 70 is controlled such that the calculated positions of the lead tips overlap with the positions of through-holes 200 of circuit board 12. Then, by operation of Z-direction moving device 72, component holding tool 77 that is holding the leaded component is lowered. Accordingly, the leads of the leaded component are inserted into through-holes 200 of circuit board 12.

Figure 12:
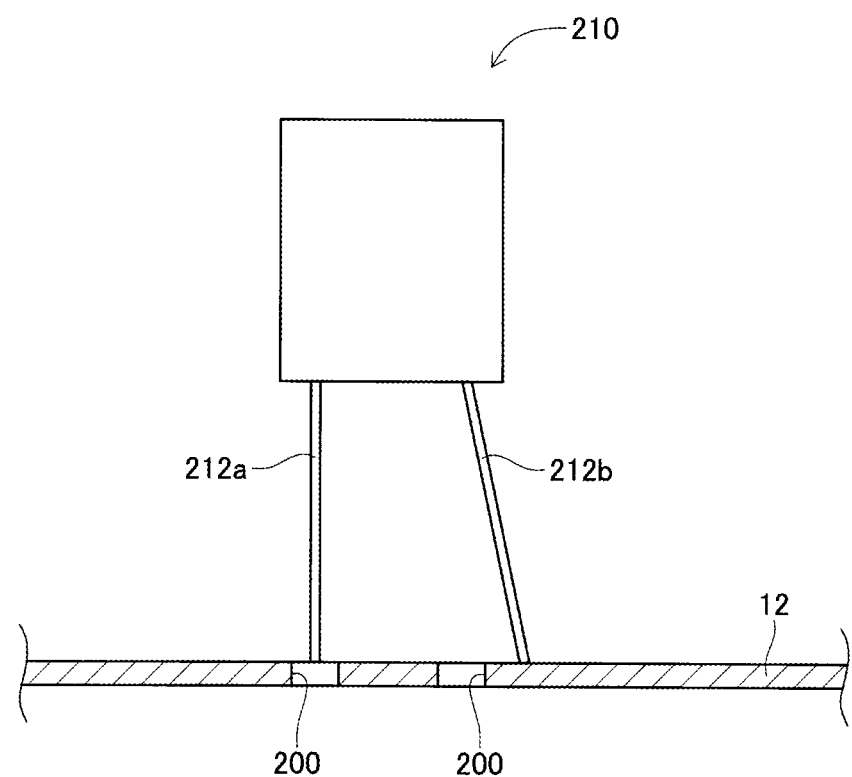
FIG. 12 is a conceptual view showing a board and leaded component during insertion of leads using a conventional method.

However, as shown in FIG. 12, in a case in which leads 212 of leaded component 210 are bent or curved, there are cases in which the lead 212 that is bent or the like contacts the upper surface of circuit board 12 and cannot be inserted into through-hole 200. Specifically, for example, when leads 212 are being inserted into through-holes 200, as shown in FIG. 12, the coordinates of the position of the tip of lead 212a of the pair of leads 212 and the coordinates of the position of through-hole 200 match in the XY directions, such that lead 212a can be inserted into the through-hole 200, but the coordinates of the position of the tip of lead 212b of the pair of leads 212 and the coordinates of the position of another through-hole 200 do not match in the XY directions, and lead 212b contacts the upper surface of circuit board 12 at a position deviation from the through-hole 200 such that lead 212b cannot be inserted into the through-hole 200. Therefore, leaded components 210 for which the coordinates of the tip position of at least one of the pair of leads 212 do not match the coordinates of the position of a through-hole 200 in the XY directions are discarded as components that cannot be mounted on circuit board 12. Alternatively, in a case in which a lead correcting device is provided in component mounter 10, mounting is performed again after correcting the lead 212b that is bent using the correcting device.

In this manner, when trying to mount leaded components 210 on circuit board 12 according to a conventional method, there are problems of discarding leaded components, or increased tact time due to correction of leads. Therefore, with component mounter 10, leaded components 93 with a pair of leads 95 with different lengths are supplied by tape feeder 88, and the leads 95 of the leaded components 93 are inserted into through-holes 200, longer leads being inserted earlier. Specifically, leaded component 93 supplied by tape feeder 88 is held by component holding tool 77. Here, component holding tool 77 holds component main body section 94 of leaded component 93 using pair of claw sections 79.

Next, the leaded component 93 held by component holding tool 77 is imaged by component camera 28 and the positions of the tips of leads 95 of the leaded component 93 are calculated. In this case, imaging of leads 95 is performed while leaded component 93 held by component holding tool 77 is being lowered. In detail, as shown in FIG. 4, component camera 28 performs imaging using side lighting from side lighting device 80, the width of the side lighting being approximately 1 mm. On the other hand, the difference between the length of long lead 95a and short lead 95b of the pair of leads 95 of leaded component 93 is approximately 1.5 mm. That is, the difference in the vertical direction between the tip position of long lead 95a and the tip position of short lead 95b is approximately 1.5 mm. Therefore, it is not possible to shine light from side lighting device 80 on the tips of both of the pair of leads 95 at the same time.

Thus, when imaging leaded component 93, first, leaded component 93 is positioned above the light that is shined from side lighting device 80, then component holding tool 77 is moved so that the side light is not shining on leads 95. Then, component holding tool 77 is moved gradually downwards by operation of Z-direction moving device 72. By this, long lead 95a of the pair of leads 95 enters the area of the side light from above. Thus, light is shone from the side on the tip of lead 95a, and the tip of lead 95a is imaged by camera 84. Then, based on the imaging data, the coordinates of the tip position of lead 95a in the XY directions are calculated. Also, the coordinates in the Z direction of the tip position of lead 95a when lead 95a entered the area of the side light are the upper limit position of the side light, and the coordinates in the Z direction of the upper limit position of the side light are used as a default value. Thus, the coordinates in the Z direction of the tip positions of lead 95a at the moment lead 95a enters the side light area are a default value (also referred to as "tip height when imaging").

Continuing, by further lowering component holding tool 77, short lead 95b of the pair of leads 95 enters the area of the side light from above. Thus, light is shone from the side on the tip of lead 95b, and the tip of lead 95b is imaged by camera 84. Then, based on the imaging data, the coordinates of the tip position of lead 95b in the XY directions are calculated. Further, when the drive source of Z-direction moving device 72 is a servo motor, the rotation angle or the like of the servo motor is detected via an encoder, and the operation amount of Z-direction moving device 72 from the time that to lead 95e enters the area of the side light to the time that lead 95b enters the area of the side light is calculated. Then, based on the operation amount, the difference in the Z direction between the tip position of lead 95a and the tip position of lead 95b, that is, the level difference distance between the tip position of lead 95a and the tip position of lead 95b, is calculated.

In this manner, with component camera 28, by performing imaging of leaded component 93 from when long lead 95a of the pair of leads 95 enters the side light to when short lead 95b enters the side light, the coordinates in the XY directions of the tip positions of lead 95a and lead 95b, the coordinates in the Z direction of the tip position of lead 95a, and the level difference distance between the tip position of lead 95a and the tip position of lead 95b are calculated. Also, the lead separation distance that is the distance between the pair of leads 95 is calculated based on the tip position in the XY directions of long lead 95*a* and the tip position in the XY directions of short lead 95*b*.

Next, it is determined whether the calculated lead separation distance is within a predetermined set range. The set range is set based on the through-hole separation distance that is the distance between the pair of through-holes 200 formed in circuit board 12, the diameter of leads 95, and the internal diameter of through-holes 200. Therefore, if the calculated lead separation distance is within the set range, it is possible to simultaneously match the coordinates in the XY directions of the pair of leads 95 with the coordinates in the XY directions of the pair of through-holes 200. In other words, when viewing both the pair of leads 95 and the pair of through-holes 200 from above or below, the pair of leads 95 and the pair of through-holes 200 can be positioned in an overlapping state aligned in the Z direction, vertical direction, height direction, and direction perpendicular with respect to circuit board 12. On the other hand, if the calculated lead separation distance is outside the set range, it is not possible to simultaneously align the coordinates in the XY directions of the pair of leads 95 and the coordinates in the XY directions of the pair of through-holes 200. In other words, when viewing both the pair of leads 95 and the pair of through-holes 200 from above or below, the pair of leads 95 and the pair of through-holes 200 cannot be positioned in an overlapping state aligned in the Z direction, vertical direction, height direction, and direction perpendicular with respect to circuit board 12. Therefore, for example, even if the coordinates in the XY directions of one of the leads of the pair of leads 95 is aligned with the coordinates of a through-hole 200, it will not be possible to align the coordinates in the XY directions of the other of the leads, and it will not be possible to insert the other lead in the through-hole 200.

Figure 13:
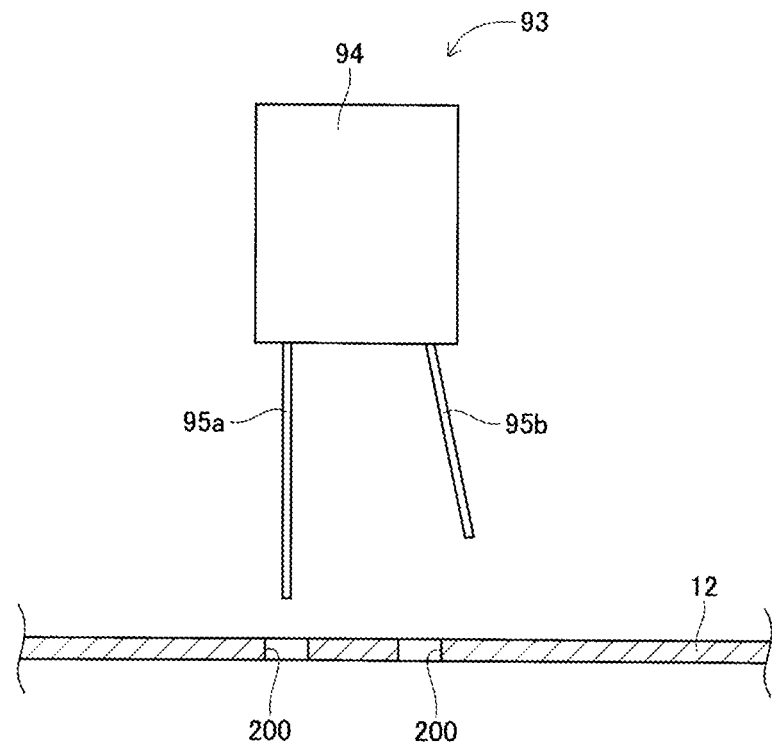
FIG. 13 is a conceptual view showing a board and leaded component during insertion of leads using a method of the present disclosure.

Thus, when the calculated lead separation distance is outside the set range, operation of X-direction moving device 68 and Y-direction moving device 70 is controlled such that the tip position of long lead 95*a* of the pair of leads 95 overlaps with the position of a through-hole 200 of circuit board 12. Thus, the coordinates in the XY directions of the tip position of long lead 95*a* and the position of through-hole 200 are aligned, and as shown in FIG. 13, the tip of long lead 95*a* overlaps through-hole 200 in the vertical direction. In other words, when viewed from above or below, lead 95*a* and the through-holes 200 are positioned in an overlapping state aligned in the Z direction, vertical direction, height direction, and direction perpendicular with respect to circuit board 12. Then, by operation of Z-direction moving device 72, component holding tool 77 that is holding the leaded component 93 is lowered. Here, component holding tool 77 is lowered such that the tip of long lead 95*a* is positioned below the upper surface of circuit board 12 by a specified distance.

Figure 14:
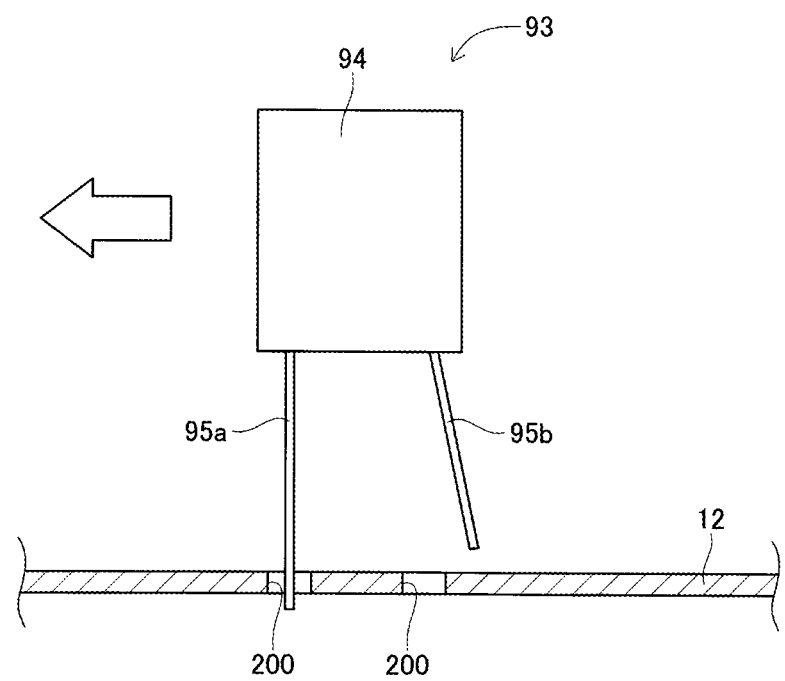
FIG. 14 is a conceptual view showing a board and leaded component during insertion of leads using a method of the present disclosure.

In detail, first, the specified distance is set to be slightly shorter than the level difference distance between the tip position of lead 95*a* and the tip position of lead 95*b*. That is, if the level difference distance is 1.5 mm, the specified distance is set to 1.0 to 1.4 mm. Also, the coordinates in the Z direction of the upper surface of circuit board 12 is the default value, and the specified distance is calculated from the default value. This calculated value is the coordinates in the Z direction of the tip position of lead 95*a* when positioned below the circuit board 12 by a specified distance of the tip of lead 95*a* from the upper surface of circuit board 12 (also referred to as "target position"). Then, operation of Z-direction driving device 72 is controlled based on the difference between the tip height when imaging and the target height. By this, as shown in FIG. 14, the tip of long lead 95*a* is inserted approximately 1.0 to 1.4 mm into through-hole 200, and the tip of short lead 95*b* is positioned above the upper surface of circuit board 12 by approximately 0.1 to 0.5 mm.

Figure 15:
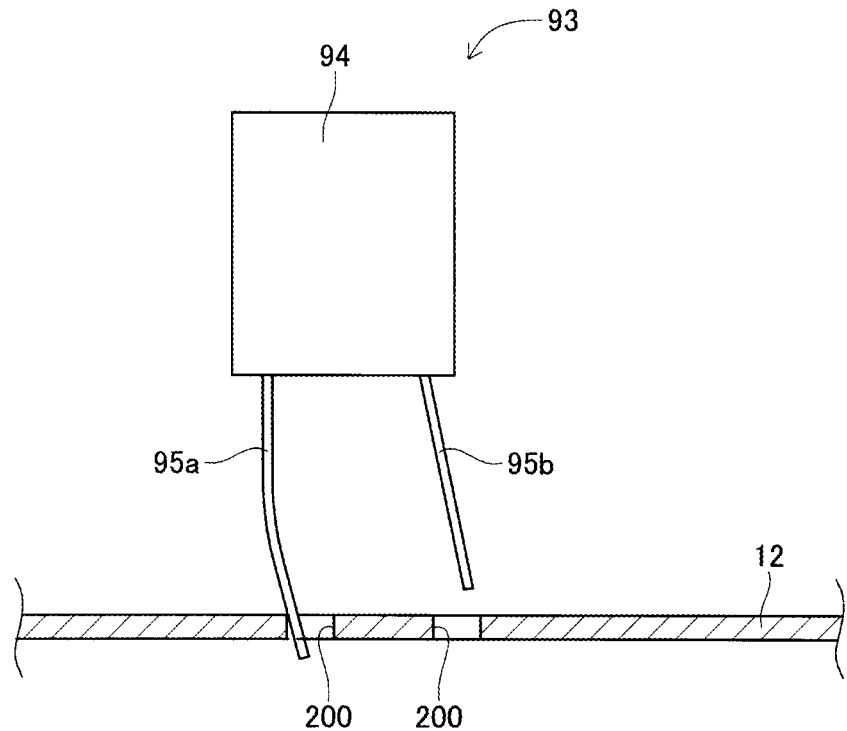
FIG. 15 is a conceptual view showing a board and leaded component during insertion of leads using a method of the present disclosure.

Continuing, operation of X-direction moving device 68 and Y-direction moving device 70 is controlled such that the tip position of short lead 95*b* of the pair of leads 95 overlaps with the position of through-holes 200 of circuit board 12. Thus, the coordinates in the XY directions of the tip position of short lead 95*ba* and the position of through-hole 200 are aligned, and as shown in FIG. 15, the tip of short lead 95*b* overlaps through-hole 200 in the vertical direction. Here, as shown in FIG. 15, long lead 95*a* that has been inserted into a through-hole 200 bends, but stays inserted in the through-hole 200 by the tip section of lead 95*a* being caught on the inner circumferential surface of the through-hole 200.

Figure 16:
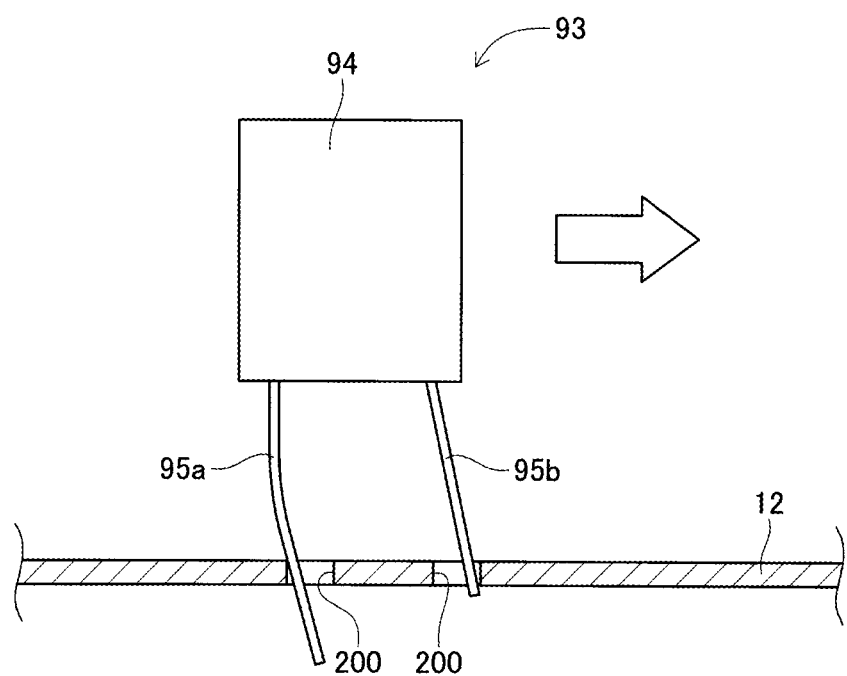
FIG. 16 is a conceptual view showing a board and leaded component during insertion of leads using a method of the present disclosure.

Then, by operation of Z-direction moving device 72, component holding tool 77 that is holding the leaded component 93 is lowered. Here, the lowering amount of component holding tool 77 is a distance equivalent to approximately 1.0 mm added to the value of the level difference between the tip position of lead 95*a* and the tip position of lead 95*b* reduced by the above specified distance. In other words, for example, if the level difference distance is 1.5 mm and the specified distance is 1.0 mm, the lowering amount of component holding tool 77 is 1.5 (=1.5−1.0+1.0) mm. By this, the tip of lead 95*b* that was positioned approximately 0.5 mm above the upper surface of circuit board 12 before the lowering of component holding tool 77, as shown in FIG. 16, is inserted into through-hole 200. Here, lead 95*b* is inserted approximately 1.0 mm into through-hole 200.

Figure 17:
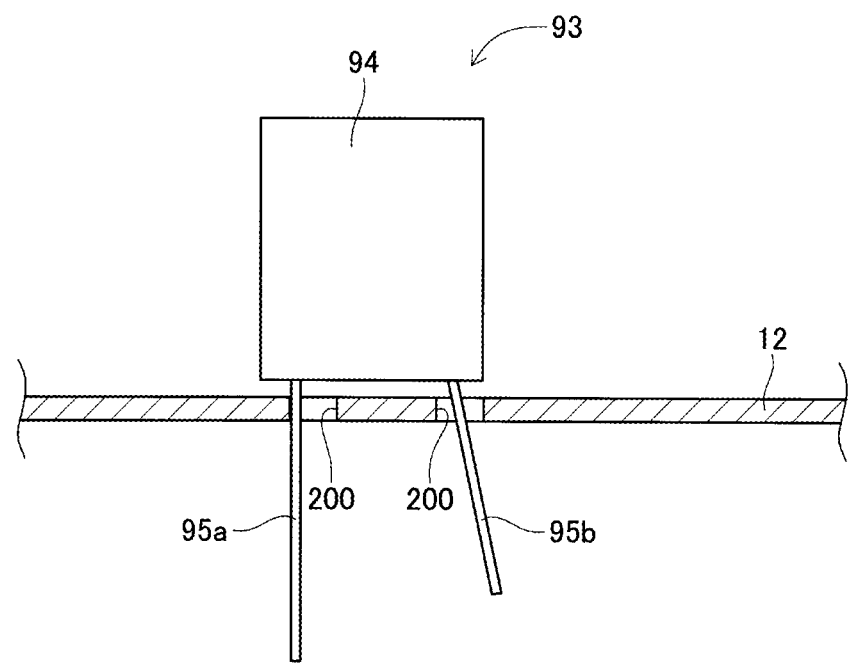
FIG. 17 is a conceptual view showing a board and leaded component during insertion of leads using a method of the present disclosure.
Figure 18:
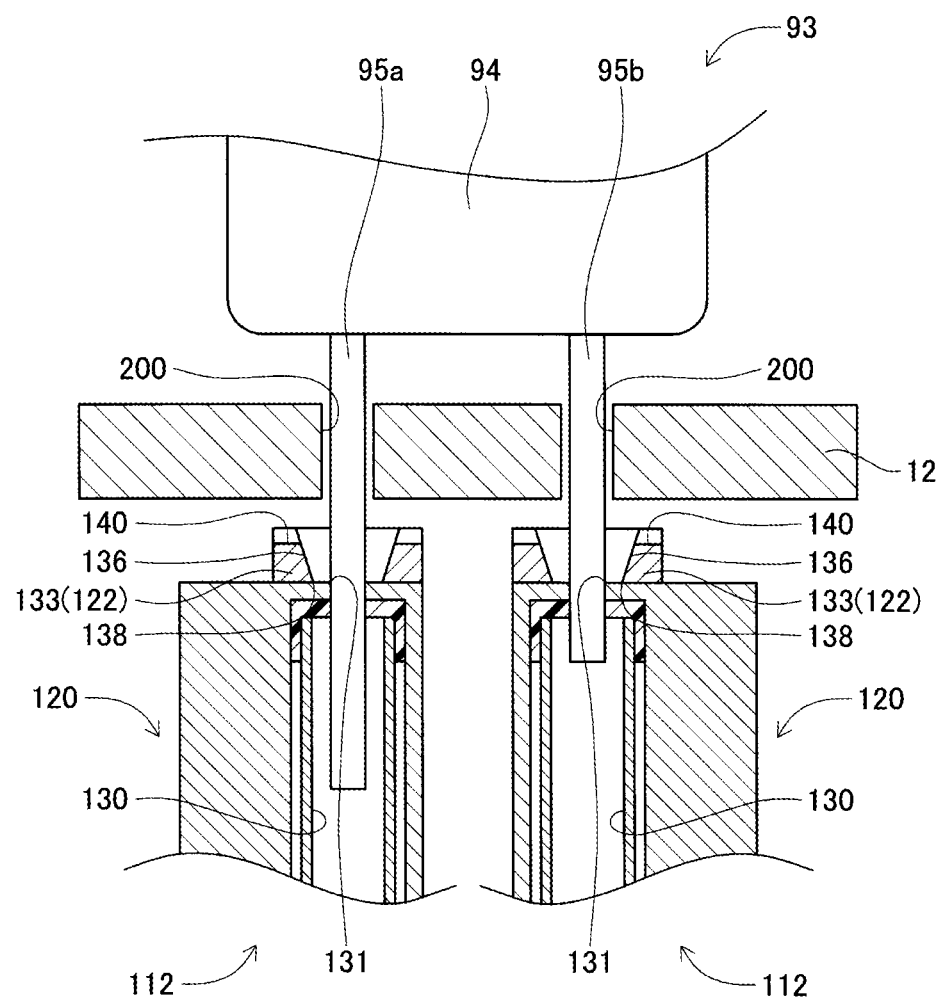
FIG. 18 is a cross section view of a cut and clinch unit immediately before leads of a leaded component are cut.

Next, when lead 95*b* has been inserted into through-hole 200, operation of X-direction moving device 68 and Y-direction moving device 70 is controlled such that the previously calculated position of the lead tip of lead 95*a* overlaps with the positions of the through-hole 200 of circuit board 12. This cancels the bending of lead 95*a*. Then, as shown in FIG. 17, operation of Z-direction moving device 72 is controlled such that long lead 95*a* and short lead 95*b* are inserted into through-holes 200 to the base section of the leaded component. By this, as shown in FIG. 18, the pair of leads 95 are inserted into second insertion holes 136 and first insertion holes 130 of slide bodies 112 of cut and clinch unit 100 via through-holes 200.

Next, when each of the pair of leads 95 has been inserted into first insertion hole 130 and second insertion hole 136, the pair of movable sections 122 is slid by operation of slide device 124. Thus, as shown in FIG. 18, leads 95 are cut by fixed blade 131 of first insertion hole 130 and movable blade 138 of second insertion hole 136. Then, the tip sections separated by the cutting of leads 95 fall through first insertion hole 130 and are discarded in discard box 132.

Also, the pair of movable sections 122, after cutting leads 95, are slid further. Therefore, the new tip section formed by the cutting of lead 95 is bent along the tapered surface of the inside of second insertion hole 136 in accordance with the sliding of movable section 122, and the tip section of lead 95 is bent along guide groove 140 by the further sliding of movable section 122. Thus, leaded component 93 is mounted into circuit board 12 in a state in which leads 95 are bent so as to be prevented from coming out of through-holes 200.

Note that, if the lead separation distance is within the set range, it is possible to simultaneously match the coordinates in the XY directions of the pair of leads 95 with the coordinates in the XY directions of the pair of through-holes 200. Therefore, operation of X-direction moving device 68 and Y-direction moving device 70 is controlled such that the position of long lead 95a overlaps the position of a through-hole, and such that the tip position of short lead 95b overlaps with another through-hole 200. By this, the tip of long lead 95a and through-hole 200 overlap in the vertical direction, and the tip of short lead 95b and through-hole 200 overlap in the vertical direction. Then, by operation of Z-direction moving device 72, component holding tool 77 that is holding the leaded component 93 is lowered such that long lead 95a is inserted into a through-hole 200, and then short lead 95b is inserted into a through-hole 200. In other words, when the lead separation distance is within the set range, after inserting long lead 95a into a through-hole 200, short lead 95b can be inserted into a through-hole 200 by lowering leaded component 93 without moving leaded component in the XY directions.

In this manner, with component mounter 10, a pair of leads with different lengths is inserted into through-holes 200 in order of the longer lead being inserted earlier, that is, the lead with the tip positioned closer to circuit board 12 being inserted earlier. Here, when inserting long lead 95a, if the coordinates in the XY directions of short lead 95b do not match the coordinates of the through-hole 200, by moving leaded component 93 in the XY directions, the coordinates in the XY directions of short lead 95b are aligned with the coordinates of the through-hole 200, and short lead 95b is inserted into the through-hole 200. By this, even if a lead 95 is bent or the like, the lead can be appropriately inserted into a through-hole 200 without needing to correct the lead, thus solving the problems of having to discard the leaded component or lengthened tact time due to lead correction.

Component mounter 10 is an example of a board work machine. Component camera 28 is an example of an imaging device. Control device 36 is an example of a control device. Work head moving device 64 is an example of a moving device. Component holding tool 77 is an example of a holding tool. Leaded component 93 is an example of a leaded component. Component main body section 94 is an example of a main body section. Lead 95 is an example of a lead. Through-hole 200 is an example of a through-hole.

Further, the present disclosure is not limited to the above example embodiments, and various changed or improved methods of embodiment are possible based on the knowledge of someone skilled in the art. Specifically, for example, in an embodiment above, a pair of leads with different lengths needs to be inserted into through-holes 200 with leads for which the tips are closer to the circuit board being inserted earlier, meaning that leads 95 are inserted in order of length, longer leads earlier; however, it is possible to insert leads 95 into through-holes 200 in an order of the position of the tip section of leads 95 that are held by component holding tool in the direction in which the tip sections extend, that is, the Z direction, the direction perpendicular to circuit board 12, the direction in which through-holes 200 extend, the vertical direction, the height direction, with the tip sections positioned lower being inserted earlier.

Also, in an embodiment above, the present disclosure is applied as an insertion method for a pair of leads with different lengths, but the disclosure may be applied as an insertion method for a pair of leads with the same length. In detail, even if the pair of leads have the same length, if a lead is curved, bent, warped, tilted, deformed, or the like, the tip positions of the pair of leads may differ in the vertical direction. Further, if the holding orientation of leaded component 93 is tilted, the tip positions of the pair of leads may differ in the vertical direction. Therefore, when inserting a pair of leads with different lengths into through-holes 200, the pair of leads may be inserted into the respective through-holes in order of proximity of the lead tips to circuit board 12, closer leads being inserted earlier. That is, the present disclosure may be applied to an insertion method for multiple leads with the same length.

Also, in an embodiment above, the disclosure is applied to leaded component 93 with pair of leads 95, but the disclosure may be applied to a leaded component with three or more leads. In this case, the three or more leads are inserted into through-holes 200 in order of proximity of the tips to circuit board 12, closer tips being inserted earlier.

Further, in an embodiment above, after inserting long lead 95a into a through-hole 200, leaded component 93 is moved in the XY directions, but as long as the coordinates in the XY directions of short lead 95b change, leaded component 93 can be moved in various ways. Specifically, for example, leaded component 93 may be moved in various ways, such as being moved along the upper surface of circuit board 12, in a direction perpendicular to the direction in which through-holes 200 extend, a direction perpendicular to the direction in which the tip section of lead 95 held by component holding tool 77 extends, or the like.

Also, in an embodiment above, after long lead 95a has been inserted into a through-hole 200 and leaded component 93 has been moved in the XY directions, leaded component 93 is lowered, such that long lead 95a and short lead 95b are inserted into through-holes 200 until reaching the base section of the component; however, after long lead 95a has been inserted into a through-hole 200, leaded component 93 may be lowered, the tip section of short lead 95b may be inserted into a through-hole 200, then, after returning leaded component 93 in the XY directions to the position before movement, long lead component 93 and short lead 95b may be inserted into through-holes 200 until reaching the base section of the component.

Further, in an embodiment above, the difference in the length of the pair of leads 95 is approximately 1.5 mm, but the leads may be set to any lengths. Also, the insertion amount of long lead 95a into the through-hole 200 is approximately 1.0 to 1.4 mm, but the insertion amount of long lead 95a into the through-hole 200 may be set to any amount so long as lead 95a does not come out of the through-hole 200 due to movement of leaded component 93 in the XY directions, and short lead 95b does not contact circuit board 12.

Figure 19:
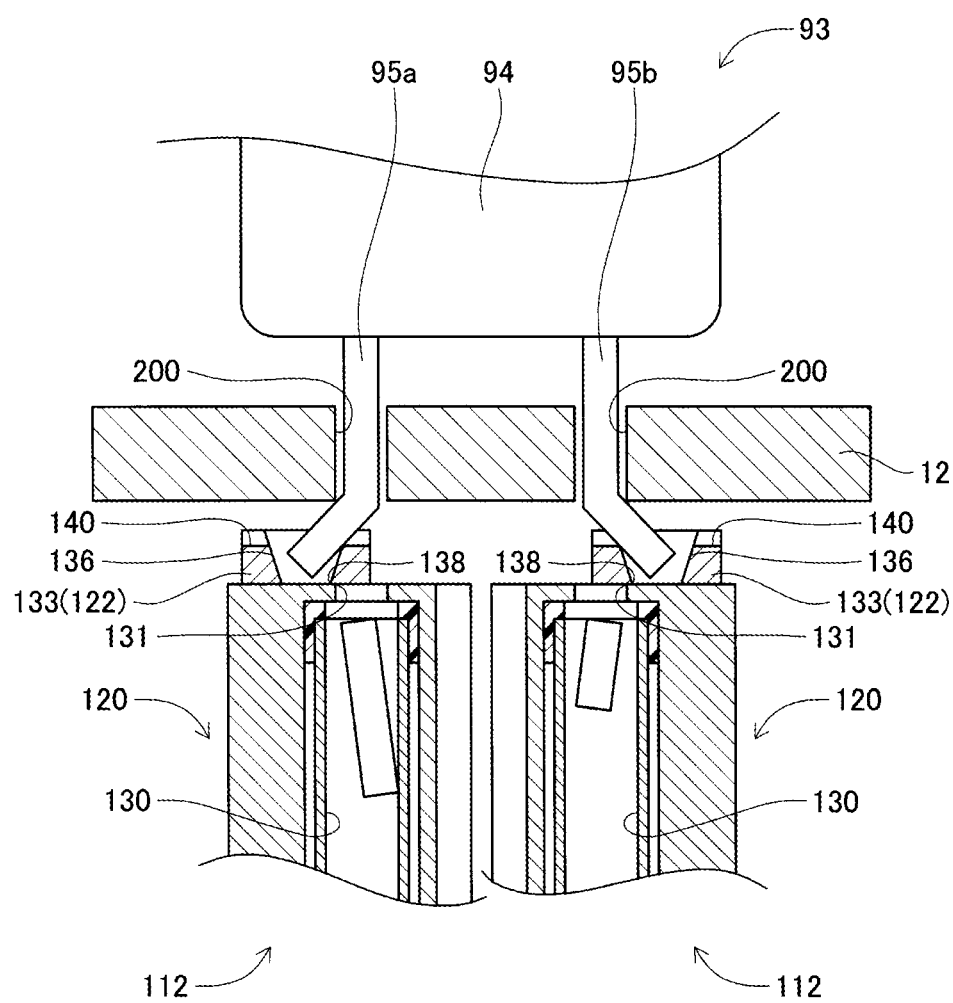
FIG. 19 is a cross section view of a cut and clinch unit after leads of a leaded component have been cut.
Figure 20:
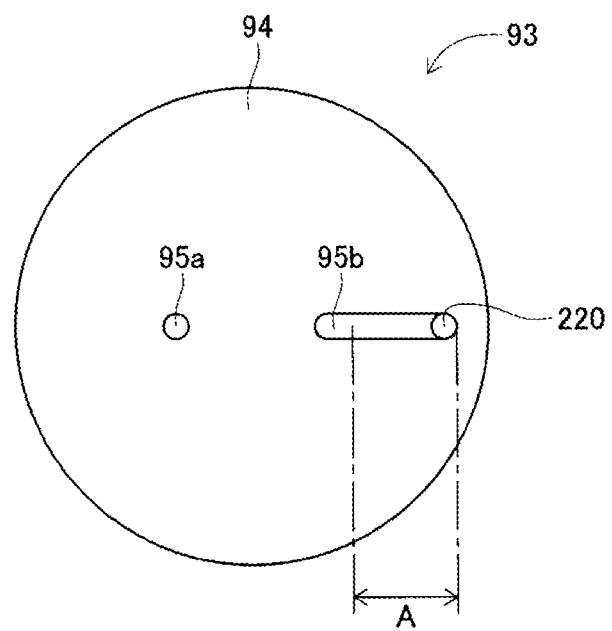
FIG. 20 shows the leaded component from below.

Further, in an embodiment above, the position of the tip surface of leads is calculated based on imaging data, and operation of X-direction moving device 68 and Y-direction moving device 70 is controlled based on that position, but operation of X-direction moving device 68 and Y-direction moving device 70 may be controlled based on a different calculated position of the leads. In detail, as shown in FIG. 19, to describe a case in which the pair of leads 94 are bent such that the tip end section of lead 95b of a pair of leads 95 get further away from the other lead of the pair, lead 95a, as the leads extend. With such a leaded component 93, lower end surface 220 of lead 95b is in a state positioned to the outside from the base section of the component, that is, at the side of lead 95b connected to component main body section 94. Based on imaging data of such a state, controller 190 may calculate set distance A with coordinates in the XY direction on the base section side from the outside edge of lower end surface 220 of lead 95b. Note that, set distance A is the internal diameter of through-hole 200. Then, operation of X-direction moving device 68 and Y-direction moving device 70 may be controlled such that the calculated coordinates are aligned with the coordinates of the through-hole 200. By this, lead 95*b* and the through-hole 200 are aligned in the vertical direction, and lead 95*b* can be appropriately inserted into the through-hole 200.

REFERENCE SIGNS LIST

10: component mounter (board work machine); 28: component camera (imaging device); 36: control device; 64: work head moving device (moving device); 77: component holding tool (holding tool); 93: leaded component; 94: component main body section; 95: lead; 200: through-hole

The invention claimed is:

1. A board work machine comprising:
a conveying device configured to clamp a board and move the board in an X-direction;
a chuck configured to hold a component main body section of a leaded component having a pair of leads of substantially a same length, the pair of leads extending from a bottom surface of the component main body section;
an X-direction slider configured to slide the chuck in the X-direction;
a Y-direction slider configured to slide the chuck in an Y-direction that is orthogonal to the X-direction;
a camera configured to image the leaded component held by the chuck; and
a control device programmed to
determine based on image data of the leaded component from the camera that a lead of the pair of leads is deformed when a separation distance between a first tip of a first lead of the pair of leads and a second tip of a second lead of the pair of leads is outside a predetermined range,
control the X-direction slider and the Y-direction slider to insert the first tip which is closer to the board into a first through-hole of the board before the second tip,
control the X-direction slider to bend the first lead by contact with an inner circumferential surface of the first through-hole and to align the second tip with a second through-hole of the board, and
control the Y-direction slider to insert the second tip into the second through-hole and then to fully insert each of the pair of leads so that the second lead does not contact an inner circumferential surface of the second through-hole.

2. The board work machine according to claim 1, wherein the camera performs imaging as the leaded component held by the chuck is being lowered.

3. The board work machine according to claim 1, wherein the pair of leads of the leaded component held by the chuck are cut in advance by a tape feeder of the board work machine.

4. The board work machine according to claim 1, wherein the camera includes a camera that images the leaded component from below and a light device that shines a light on the leaded component from a side.

5. An insertion method for a board work machine provided with a conveying device configured to clamp a board and move the board in an X-direction, a chuck configured to hold a component main body section of a leaded component with a pair of leads of substantially a same length, the pair of leads extending from a bottom surface of the component main body section, an X-direction slider configured to move the chuck in the X-direction, and a Y-direction slider configured to move the chuck in an Y-direction that is orthogonal to the X-direction, the insertion method comprising:
determining based on image data of the leaded component from a camera that a lead of the pair of leads is deformed when a separation distance between a first tip of a first lead of the pair of leads and a second tip of a second lead of the pair of leads is outside a predetermined range;
controlling the X-direction slider and the Y-direction slider to insert the first tip which is closer to the board into a first through-hole of the board before the second tip;
controlling the X-direction slider to bend the first lead by contact with an inner circumferential surface of the first through-hole and to align the second tip with a second through-hole of the board; and
controlling the Y-direction slider to insert the second tip into the second through-hole and then to fully insert each of the pair of leads so that the second lead does not contact an inner circumferential surface of the second through-hole.

\* \* \* \* \*